(12) United States Patent
Erb et al.

(10) Patent No.: US 8,576,024 B2
(45) Date of Patent: Nov. 5, 2013

(54) ELECTRO-ACOUSTIC FILTER

(75) Inventors: Jean-Luc Erb, San Diego, CA (US); Maha Achour, Encinitas, CA (US)

(73) Assignee: Hollinworth Fund, L.L.C., Dover, DE (US)

( * ) Notice: Subject to any disclaimer, the term of this patent is extended or adjusted under 35 U.S.C. 154(b) by 434 days.

(21) Appl. No.: 12/950,908

(22) Filed: Nov. 19, 2010

(65) Prior Publication Data

US 2011/0193656 A1    Aug. 11, 2011

Related U.S. Application Data

(60) Provisional application No. 61/303,596, filed on Feb. 11, 2010, provisional application No. 61/311,706, filed on Mar. 8, 2010, provisional application No. 61/329,279, filed on Apr. 29, 2010, provisional application No. 61/366,525, filed on Jul. 21, 2010, provisional application No. 61/376,234, filed on Aug. 23, 2010, provisional application No. 61/379,361, filed on Sep. 1, 2010, provisional application No. 61/380,188, filed on Sep. 3, 2010.

(51) Int. Cl.
    *H03H 9/70*    (2006.01)
    *H03H 9/72*    (2006.01)
    *H03H 9/54*    (2006.01)
    *H03H 9/64*    (2006.01)

(52) U.S. Cl.
    USPC ............................ 333/133; 333/189; 333/193

(58) Field of Classification Search
    USPC ......................................... 333/133, 187–196
    See application file for complete search history.

(56) References Cited

U.S. PATENT DOCUMENTS

| | | | | |
|---|---|---|---|---|
| 2,222,417 | A * | 11/1940 | Mason | 333/190 |
| 3,731,230 | A * | 5/1973 | Cerny, Jr. | 331/116 R |
| 4,158,787 | A * | 6/1979 | Forward | 310/51 |
| 5,093,638 | A * | 3/1992 | Kinsman et al. | 333/195 |
| 5,499,002 | A * | 3/1996 | Kinsman | 333/187 |
| 5,654,680 | A | 8/1997 | Kwan et al. | |
| 5,933,062 | A * | 8/1999 | Kommrusch | 333/193 |
| 6,472,954 | B1 * | 10/2002 | Ruby et al. | 333/133 |
| 6,549,100 | B2 * | 4/2003 | Taniguchi | 333/193 |
| 6,670,866 | B2 | 12/2003 | Ella et al. | |

(Continued)

FOREIGN PATENT DOCUMENTS

| | | | |
|---|---|---|---|
| JP | 4-134913 | * | 5/1992 |
| JP | 2001-217649 | * | 8/2001 |

(Continued)

OTHER PUBLICATIONS

R. Ruby et al.; "Method of Extracting Unloaded Q Applied Across Different Resonator Technologies"; 2008 IEEE Ultrasonics Symposium, Nov. 2-5, 2008, pp. 1815-1818.*

(Continued)

*Primary Examiner* — Barbara Summons
(74) *Attorney, Agent, or Firm* — Novak Druce Connolly Bove + Quigg LLP

(57) ABSTRACT

A device includes a plurality of electrode actuated acoustic resonators coupled to form complementary paths to operate as a filter. Each acoustic resonator has an electrical input and an electrical output that contributes to a static capacitance. A compensation impedance is coupled to at least one of the paths to reduce adverse effects from the static capacitances of the acoustic resonators.

24 Claims, 7 Drawing Sheets

(56) References Cited

U.S. PATENT DOCUMENTS

| | | | |
|---|---|---|---|
| 6,741,146 B2* | 5/2004 | Ella | 333/133 |
| 7,095,297 B2* | 8/2006 | Xu et al. | 333/187 |
| 7,135,940 B2* | 11/2006 | Kawakubo et al. | 333/17.1 |
| 7,319,371 B2* | 1/2008 | Ten Dolle et al. | 333/188 |
| 7,352,262 B2* | 4/2008 | Xu et al. | 333/187 |
| 7,592,957 B2 | 9/2009 | Achour et al. | |
| 7,764,232 B2 | 7/2010 | Achour et al. | |
| 7,804,374 B1* | 9/2010 | Brown et al. | 331/116 R |
| 7,839,216 B2 | 11/2010 | Alidio et al. | |
| 2005/0206476 A1 | 9/2005 | Ella et al. | |
| 2007/0035365 A1* | 2/2007 | Carpentier | 333/205 |
| 2007/0243832 A1 | 10/2007 | Park et al. | |
| 2008/0024244 A1* | 1/2008 | Cathelin et al. | 333/190 |
| 2008/0197943 A1* | 8/2008 | Xu et al. | 333/194 |
| 2009/0128446 A1 | 5/2009 | Gummalla et al. | |
| 2009/0135087 A1 | 5/2009 | Gummalla et al. | |
| 2009/0160578 A1 | 6/2009 | Achour | |
| 2009/0273415 A1 | 11/2009 | Frank et al. | |
| 2009/0295660 A1 | 12/2009 | Xu et al. | |
| 2009/0316612 A1 | 12/2009 | Poliasne et al. | |
| 2010/0157858 A1 | 6/2010 | Lee et al. | |
| 2010/0207703 A1 | 8/2010 | Dupuy et al. | |
| 2011/0175789 A1 | 7/2011 | Lee et al. | |
| 2011/0210787 A1 | 9/2011 | Lee et al. | |

FOREIGN PATENT DOCUMENTS

| | | |
|---|---|---|
| JP | 2001-223559 A | 8/2001 |
| JP | 2006-513662 A | 4/2006 |
| KR | 10-2005-0017980 A | 2/2005 |

OTHER PUBLICATIONS

G.C. Fattinger et al., "Optimization of Acoustic Dispersion for High Performance Thin Film BAW Resonators," 2005 IEEE Ultrasonics Symposium, pp. 1175-1178, 2005.

R. Aigner, "SAW and BAW Technologies for RF Filter Applications: A Review of the Relative Strengths and Weaknesses," Proceedings of 2008 IEEE International Ultrasonics Symposium, pp. 582-589, 2008.

R. Aigner, "Bringing BAW Technology into Volume Production: The Ten Commandments and the Seven Deadly Sins," TriQuint Semiconductor, Feb. 2007, 7 pages.

T. Sowlati et al., "Single-chip multiband WCDMA/HSDPA/HSUPA/EGPRS transceiver with diversity receiver and 3G DigRF interface without SAW filters in transmitter/3G receiver paths", in Proc. IEEE ISSCC, 2009, pp. 116-117, Feb. 8-12, 2009.

K.-L. Wu et al., "A Direct Synthesis Approach for Microwave Filters with a Complex Load and Its Application to Direct Diplexer Design," IEEE Trans. on Microwave Theory and Techniques, vol. 55, No. 5, May 2007.

"Three and Four Port S-Parameter Measurements," Anritsu Application Note, 2002, pp. 1-16.

A. Garcia-Lampérez, S. Llorente-Romano, M. Salazar-Palma, and T. K. Sarkar, "Efficient electromagnetic optimization of microwave filters and multiplexers using rational models," IEEE Trans. Microw. Theory Tech., vol. 52, No. 2, pp. 508-521, Feb. 2004.

G. Macchiarella and D. Traina, "A formulation of the Cauchy method suitable for the synthesis of lossless circuit models of microwave filters from lossy measurements," IEEE Microw.Wireless Compon. Lett., vol. 16, No. 5, pp. 243-245, May 2006.

C. T.-C. Nguyen, "Vibrating RF MEMS technology: fuel for an integrated micromechanical circuit revolution? (invited)" Dig. of Tech. Papers, the 13th Int. Conf. on Solid-State Sensors & Actuators (Transducers'05), Seoul, Korea, Jun. 5-9, 2005, pp. 243-246.

A. B Yu et al., "Wide Tuning Range MEMS Band-Pass Filter with Inductance Change" Dig. of Tech. Papers, the 13th Int. Conf. on Solid-State Sensors & Actuators (Transducers'05), Seoul, Korea, Jun. 5-9, 2005, pp. 2061-2064.

Itoh, T. Invited paper : Prospects for metamaterials. Electronics Letters, vol. 40, No. 16, Aug. 5, 2004, pp. 972-973.

A. Rennings et al., "Extended Composite Right/Left-Handed Metamaterial and Its Application as Quadband Quarter-Wavelength Transmission Line," Proc. Asia-Pacific Microwave Conf., 2006.

International Search Report issued in International Application No. PCT/US20101057883, mailed Aug. 30, 2011.

International Preliminary Report on Patentability and Written Opinion issued in International Application No. PCT/US2010/057883, dated Aug. 14, 2012.

* cited by examiner

ELECTRO-ACOUSTIC FILTER

RELATED APPLICATION

This application claims priority to U.S. Provisional Application Ser. No. 61/303,596 (entitled FILTERS AND RESONATORS FOR MONOLITHIC INTEGRATION, filed Feb. 11, 2010), U.S. Provisional Application Ser. No. 61/311,706 (entitled FILTERS BASED ON ACOUSTIC WAVE RESONATORS, filed Mar. 8, 2010), U.S. Provisional Application Ser. No. 61/329,279 (entitled FILTERS AND RESONATORS, filed Apr. 29, 2010), U.S. Provisional Application Ser. No. 61/366,525 (entitled FILTERS AND RESONATORS, filed Jul. 21, 2010), U.S. Provisional Application Ser. No. 61/376,234 (entitled HYBRID ELECTRIC/ACOUSTIC DEVICES, filed Aug. 23, 2010), U.S. Provisional Application Ser. No. 61/379,361 (entitled WIDEBAND POWER AMPLIFIER AND FRONT END MODULES, filed Sep. 1, 2010), and U.S. Provisional Application Ser. No. 61/380,188 (entitled FILTERS AND RESONATORS, filed Sep. 3, 2010), which are incorporated herein by reference.

BACKGROUND

Filters in communications devices are used to process signals for wireless transmission and are also used to provide duplexing and switching functions. Such filters may be designed to minimize insertion loss and provide high filter selectivity and frequency rejection, while satisfying various frequency bandwidth requirements.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense.

In one example embodiment, a device includes a plurality of electrode actuated acoustic resonators coupled to form complementary paths to operate as a filter. Each acoustic resonator has an electrical input and an electrical output that contributes to a static capacitance. A compensation impedance is coupled to at least one of the paths to reduce adverse effects from the static capacitances of the acoustic resonators. The compensation impedance may be referred to as a static capacitance compensation impedance.

In a further embodiment, a method includes determining a first sum of static capacitances in a first set of acoustic resonator paths in a filter. A second sum of static capacitances in a second set of acoustic resonator paths in the filter is also determined. The second set of paths is complementary to the first set of paths. A compensation impedance is then added to at least one of the paths as a function of the first and second sums.

Filters may be used in communication devices to pass a frequency region and reject others; for example, filters are used to separate transmission (Tx) signals from received (Rx) signals. Some applications use a band pass filter to pass frequencies in a desired range and attenuate frequencies outside that range. In order to minimize insertion loss and provide high filter selectivity and frequency rejection, while satisfying various frequency bandwidth requirements, the present invention utilizes electromechanical resonators. Electromechanical resonators are used to provide a high quality factor, Q, and thus improve filter performance. In various embodiments, the resonators may be surface or bulk wave acoustic resonators, or one of many different micro or nano resonators that are available.

Figure 1A:
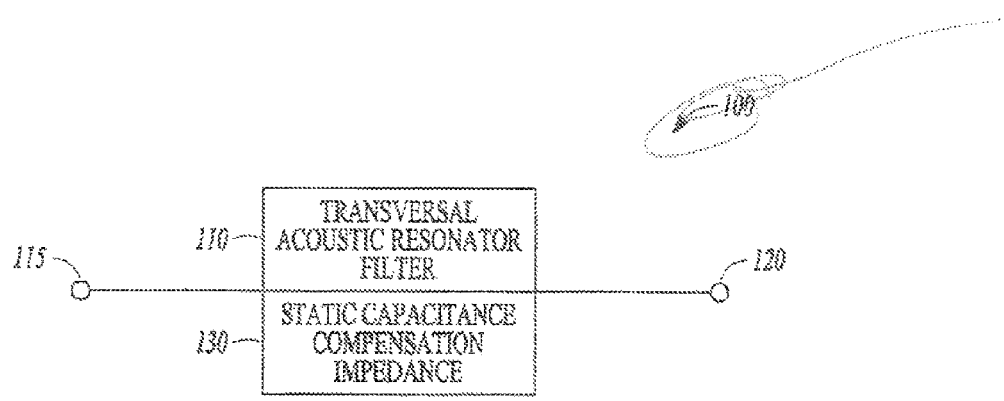
FIG. 1A is a block diagram of a filter employing acoustic resonators and a static capacitance compensation impedance according to an example embodiment.

FIG. 1A is a block diagram illustrating a transversal electromechanical resonator based filter 110 having an input 115 and an output 120, commonly referred to as source and load respectively. Transversal resonator filters generally have two or more complementary paths, one of which is referred to as straight, and the other is referred to as complementary, or phase shifted. In one embodiment, a difference in static capacitance may exist between the paths; as illustrated in FIG. 1, a static capacitance compensation impedance 130 is coupled to at least one of the paths to compensate for this difference and effectively absorb the static capacitance. Several different embodiments or transversal resonant filters with different compensation impedances are described in further embodiments.

Figure 1B:
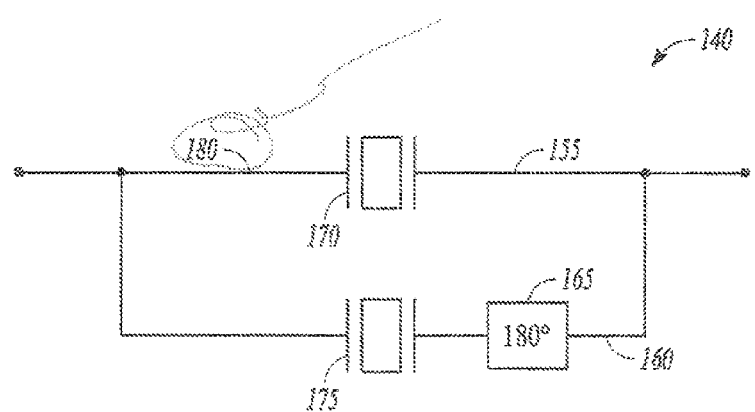
FIG. 1B is a prior art block schematic diagram of a single-ended transverse filter having electric acoustic resonators according to an example embodiment.

FIG. 1B is a block schematic diagram of a single-ended transverse filter 140 having a straight path 155. A complementary criss-cross path 160 has a 180° phase shifter 165. Examples of 180° phase shifters include a 180° delay line, a metamaterials phase shifter, a coupled-coil transformer, a coupled-line microstrip, and others. Both paths also have an acoustic resonator as indicated respectively at 170 and 175.

Figure 2A:
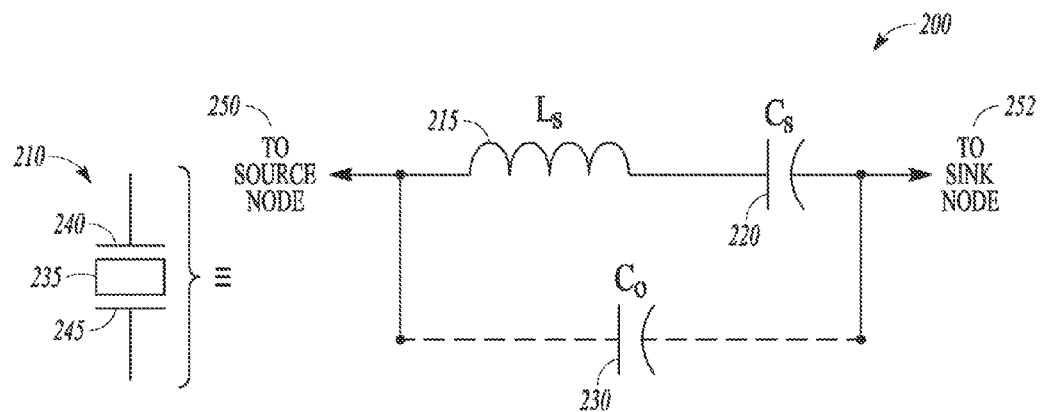
FIG. 2A is a prior art block schematic equivalent circuit diagram of an electric acoustic resonator.

FIG. 2A is a block schematic equivalent circuit diagram 200 of a prior art electric acoustic resonator 210. The equivalent circuit diagram 200 is a simplified model, with the resonator 210 modeled by a series connected inductor $L_s$ 215 and capacitor $C_s$ 220 positioned between input 250 to source node (not shown) and output 252 to sink node (not shown). The series configuration of inductor 215 and capacitor 220 represents a mechanical behavior of the resonator 210. A series resistive component (not shown) together with the capacitive component $C_s$ 220 and inductive component $L_s$ 215 establish the series resonance $f_s$ of the resonator 210 at which the resonator 210 has minimum impedance. In addition, equivalent circuit diagram 200 includes a static capacitance represented as $C_o$ 230, coupled in parallel with the inductive and capacitive components, 215 and 220. $C_o$ 230 may also be referred to as a parasitic capacitance, and may be referred to as a parallel capacitance $C_p$. $C_o$ 230 is mostly a result of an electrical capacitance resulting from electrodes 240 and 245 used to electrically excite the medium 235 between the electrodes and forming the physical resonator 210.

At frequencies above $f_s$ the static capacitance $C_o$ 230, along with a small static resistance component, $R_p$ (not shown), contribute to define a parallel resonance $f_p$ at which the resonator 210 has maximum impedance. The resonator 210 has a mechanical component, which is represented in the series circuit and which is due to introduction of the mechanical oscillations of the resonator 210. One type of resonator is a piezoelectric resonator, such as a quartz crystal or Aluminum Nitride (AlN). The material used to build the resonator performs two functions: i) keeps the resonator dimensionally stable ensuring the resonant frequency remains constant over temperature changes, and ii) enables conversion of mechanical vibrations into an oscillating electrical voltage. The series resonance frequency $f_s$ is also referred to as the resonance, or resonant, frequency. The parallel resonance frequency $f_p$ is also referred to as an "anti-resonance" or "anti-resonant" (AR) frequency.

An acoustic resonator is a type of mechanical resonator built to take advantage of a mechanical resonance frequency in an acoustic structure. An electromechanical (EMC) resonator, such as a resonator having an equivalent circuit 200 (as in FIG. 2A), identifies a resonant frequency in a complex excitation, such as an impulse or a transmission signal and may be used to filter out all other frequencies. Acoustic resonators, or acoustic wave resonators, specifically take advantage of the acoustic-wave propagation effects where the acoustic wave produces a disturbance in an elastic medium 235 that propagates in time and space. Such propagation acts as the energy is transferred from the source and along the medium in the form of vibrations or oscillations. Acoustic wave resonators include Surface Acoustic Wave (SAW) type and Bulk Acoustic Wave (BAW) type; both of which use a structure which encloses the medium or material, such as a piezoelectric material and two electrodes.

One physical implementation of the resonator 210 is as a BAW resonator which is represented schematically at 200 in FIG. 2A as described above. Alternate embodiments may utilize other types of EMC resonators such as SAW resonators. The equivalent circuit 200 of FIG. 2A includes a motional inductance referred to as Lm, and a motional capacitance referred to as $C_m$.

The above resonators, and other acoustic and mechanical resonators, are well suited for constructing a Band Pass Filter (BPF). For instance, a shunt acoustic resonator may be regarded as a Band Stop Filter where a Band Stop Resonator (BSR) is loaded with a parallel capacitor which contributes to the generation of an anti-resonance mode. A Band Stop Filter (BSF) attenuates a small range of frequencies while passing all other frequencies. A series acoustic resonator may be regarded as a BPF incorporating a Band Pass Resonator (BPR) loaded with a parallel or static capacitor $C_o$, which contributes to the generation of an anti-resonance mode having an AR frequency behavior.

Such acoustic resonators may be coupled in a high-order ladder or lattice architecture to build a filter; however, in such configurations, the AR frequency behavior introduces a limit to the available bandwidth and selectivity of the filter. In one embodiment of the present invention, a transversal configuration with complementary paths provides for acoustic resonator based filters. The resonators are substantially isolated from each other to minimize capacitive coupling between resonators and effectively eliminate inductive coupling.

In some embodiments, at least one resonator path is provided with a compensation impedance, such as a compensation capacitor $C_e$ to minimize adverse effects of the static capacitance $C_o$ present in the set of acoustic resonators forming the paths of the filter. A compensation capacitor may be coupled in parallel with a resonator, such as resonator 210. In further embodiments, such as those described hereinbelow, different impedances may be used in different portions of a path in a transversally configured filter. In some embodiments, acoustic resonators are building blocks for a new class of BPFs constructed using a transversal filter configuration which effectively absorbs the static capacitance $C_o$.

Figure 2B:
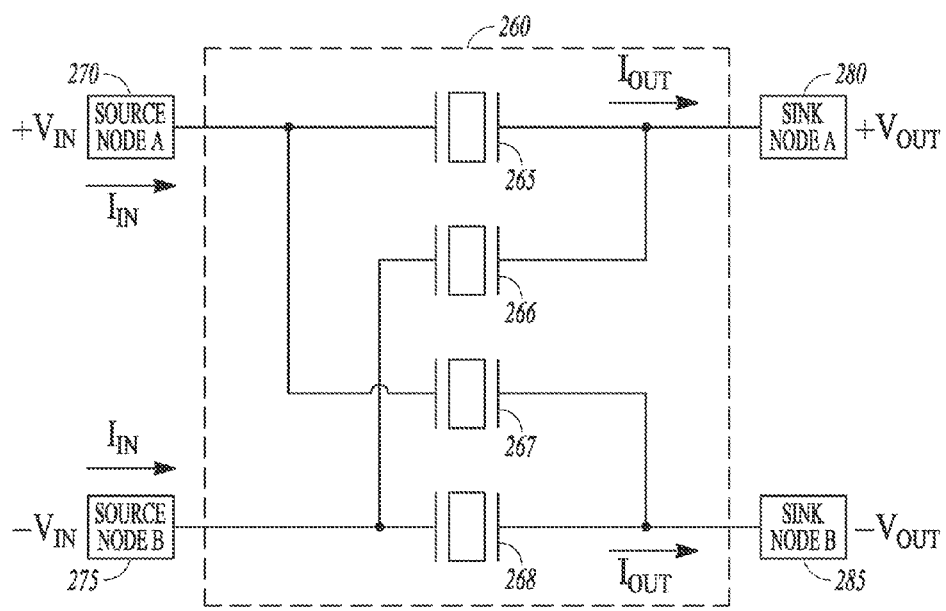
FIG. 2B is a prior art block schematic diagram of a transverse filter using electric acoustic resonators according to an example embodiment.

FIG. 2B is block schematic diagram of a transverse filter using electric acoustic resonators. An example transversal filter having a $2^{nd}$ order differential filter configuration is illustrated generally as differential filter 260. The $2^{nd}$ order differential transversal filter 260 includes several acoustic resonators 265, 266, 267, 268 coupled in a transverse differential manner. As illustrated, the differential filter 260 is a two-port differential configuration including two input or source nodes 270, 275 and two outputs or sink nodes 280, 285. Source node A 270 and source node B 275 are coupled to input voltage signals to be filtered and selectively provided to the resonators 265, 266, 267, 268. Sink node A 280 and sink node B 285 are coupled to the resonators 265, 266, 267, 268 as illustrated to selectively provide output voltages.

The differential filter 260 is a transversal filter, having straight paths including resonators 265 and 268. The differential filter 260 further has crossed paths, referred to as criss-cross or criss-crossed paths), that include resonators 266 and 267, which connect source node A 270 to sink node B 285 and source node B 275 and sink note A 280, respectively. The phase of the signals provided to source node B 275 are 180° out of phase from the signals at source node A, and thus the signals at source node B 275 are referred to as anti-phase signals. Similarly, the phase of the signals received at sink node B are 180° out of phase from signals received at sink node A 280. In various embodiments, each path includes a resonator such as resonator 200, or resonators 300, 400, 500, or 600 described hereinbelow, without a compensation impedance. Each resonator may exhibit a unique behavior and need not be identical. However, a typical embodiment will have resonators 265 and 266 identical to resonators 268 and 267, respectively. In other words, the electrical and mechanical behaviors of the straight path and the criss-cross path are similar.

Figure 3:
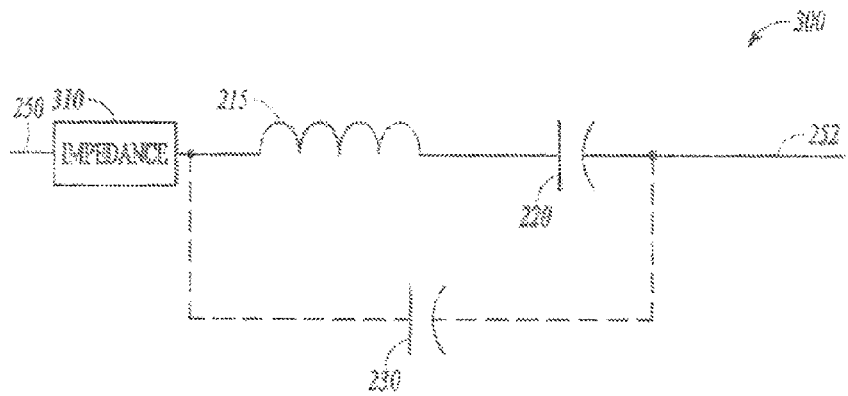
FIG. 3 is a block schematic equivalent circuit diagram of an electric acoustic resonator having a complex compensation impedance according to an example embodiment.

Several further embodiments utilizing one or more compensation impedances for at least one path of a transversal filter are illustrated in FIGS. 3, 4, 5 and 6, wherein the numbering of components is maintained from figure to figure for like components. In FIG. 3, a complex series impedance is illustrated for a path containing an acoustic resonator 300 modeled by components $L_s$ 215, $C_s$ 220, and static capacitance $C_o$ 230. These components are positioned between input 250 and output 252. The compensation impedance 310 is positioned on a source side of the resonator 300, coupled between the resonator 300 and input 250. In further embodiments, the compensation impedance 310 may be coupled at the sink side of the resonator 300, or at both the source and the sink. The compensation impedance 310 is selected to remove the effect of the static capacitive difference between the complementary paths, effectively balancing the impedances of the straight and criss-cross paths to remove the static capacitive effects on bandwidth. In some embodiments, the compensation impedance may be a capacitive element, or an element with a determined capacitance, an inductor, or an element with a determined inductance, or a combination of both.

Figure 4:
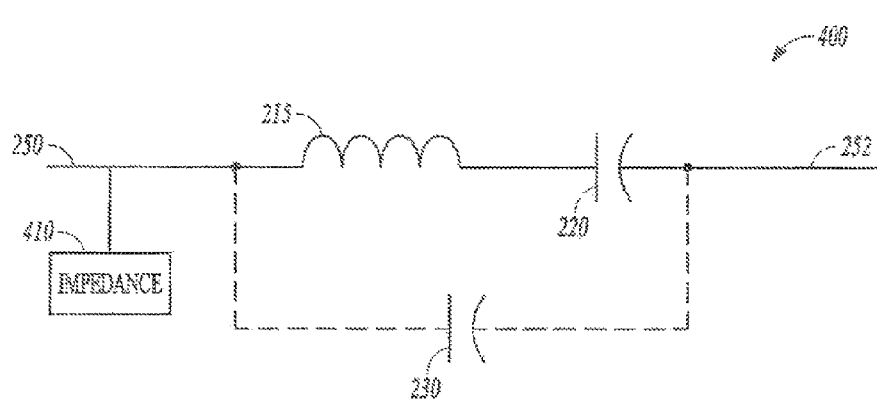
FIG. 4 is a block schematic equivalent circuit diagram of an electric acoustic resonator having a compensation impedance according to an example embodiment.

FIG. 4 illustrates an acoustic resonator 400 having a compensation impedance 410, which is coupled to the source side of the resonator 400. In one embodiment, the compensation impedance 410 includes an inductor, providing a negative capacitance to reduce the effects of the static capacitor. The compensation impedance 410 is connected between input 250 and a reference node, and in some embodiments is coupled to a ground electrode and thus forms a shunt impedance. In some embodiments, the compensation impedance 410 is coupled between sources of a dual-ended differential transversal filter. The compensation impedance may be positioned in a variety of positions depending on the design and operating specifics of a filter. For example, one or more compensation impedances 410 may be used at the source, the sink, or both the source and the sink in further embodiments.

Figure 5:
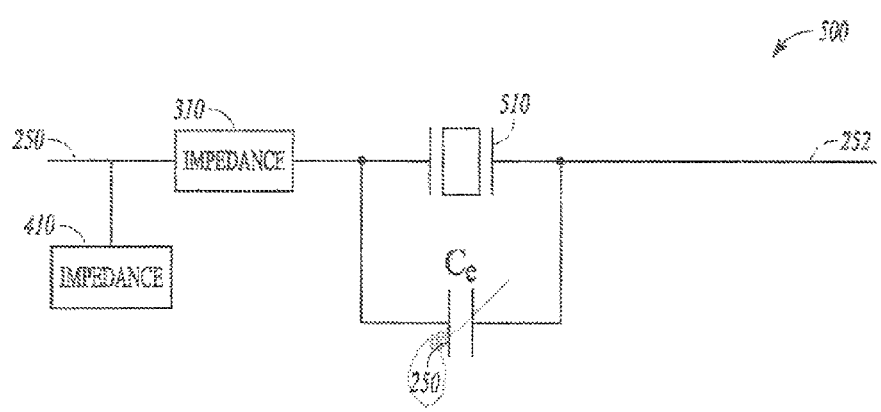
FIG. 5 is a block schematic equivalent circuit diagram of an electric acoustic resonator having multiple compensation impedances according to an example embodiment.

FIG. 5 illustrates an example embodiment using one or more compensation impedances, such as 310 or 410, to offset the effects of the static capacitance $C_o$ for acoustic resonator 510. In one embodiment, impedances 310 and 410 may be used to offset the static capacitive effects of multiple paths by using them on a selected path of a transversal filter. The configuration of compensation impedances is designed to cancel out or absorb the static capacitance of the acoustic resonator.

Figure 6:
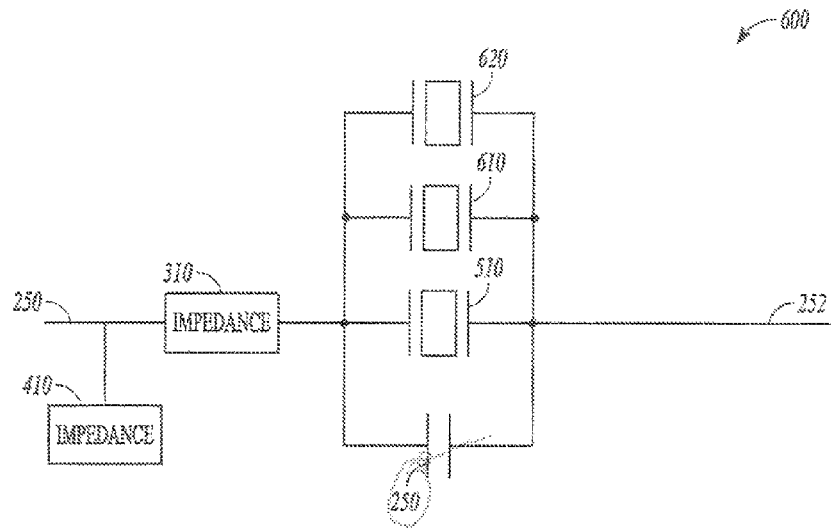
FIG. 6 is a block schematic equivalent circuit diagram of an electric acoustic resonator illustrating multiple resonators in a path with multiple compensation impedances according to an example embodiment.

FIG. 6 illustrates an acoustic resonator 600 having the compensation impedances 310, 410 of FIG. 5 as well as multiple resonators 510, 610, 620, or more coupled in parallel. The parallel resonators may be considered as one path including multiple resonator paths. By using one or more of the compensation impedances, different paths in the filter may have different numbers and different sizes of resonators. The use of compensation impedances provides a further degree of freedom in designing filters, since various resonators or sets of resonators need not be matched, and thus may avoid additional circuitry and design associated with matching input impedance of a device.

Figure 7:
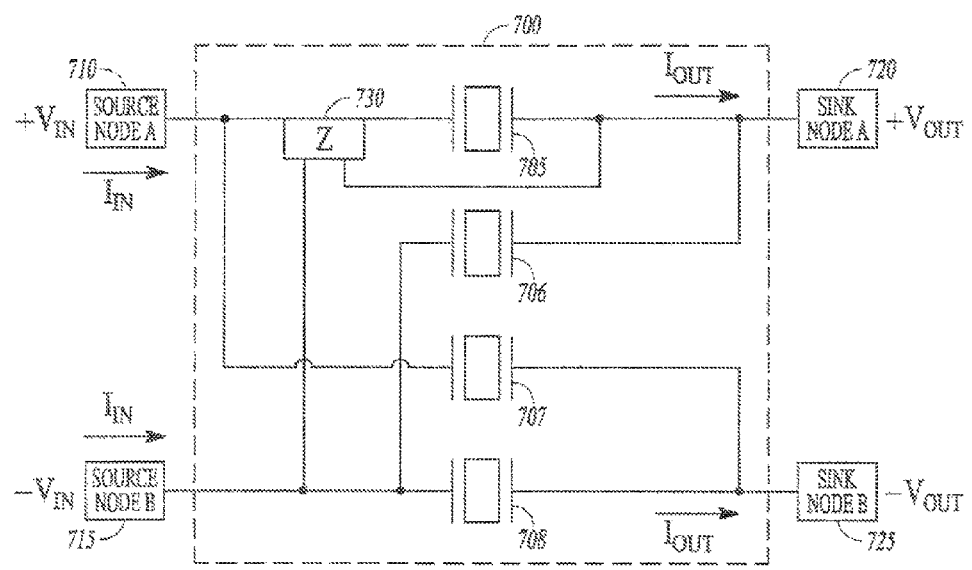
FIG. 7 is a block schematic diagram of a transversal filter having electric acoustic resonators according to an example embodiment.

An example transversal filter having a $2^{nd}$ order differential filter configuration is illustrated generally as differential filter 700 in FIG. 7. The $2^{nd}$ order differential transversal filter 700 includes several acoustic resonators 705, 706, 707 708 coupled in a transverse differential manner. As illustrated, the differential filter 700 is a two-port differential configuration including two input or source nodes 710, 715 and two outputs or sink nodes 720, 725. Source node A 710 and source node B 715 are coupled to input voltage signals to be filtered and selectively provided to the resonators. Sink node A 720 and sink node B 725 are coupled to the resonators to selectively provide output voltages.

The differential filter 700 is a transversal filter, having straight paths including resonators 705 and 708. The differential filter 700 further has crossed (or criss-crossed) paths that include resonators 706 and 707, which connect source node B 715 to sink node A 720 and source node A 710 and sink node B 725, respectively. The phase of the signals provided to source node B 715 are 180° out of phase from the signals at source node A 710, and thus the signals at source node B 715 are referred to as anti-phase signals. Similarly, the phase of the signals received at sink node B 725 are 180° out of phase from signals received at sink node A 720. In various embodiments, each path includes a resonator, such as resonator 210, with or without a compensation impedance. Each resonator may exhibit a unique behavior and need not be identical.

At least one of the paths of differential filter 700 has an associated compensation impedance 730, which may be implemented as compensation impedance 310 and/or 410. A variety of compensation impedances as well as configurations may be implemented to absorb the static capacitance of an acoustic resonator. Compensation impedance 730 is associated with the resonator 705 path. In various embodiments, resonator 705 may further include one or more resonators coupled in parallel.

Figure 8:
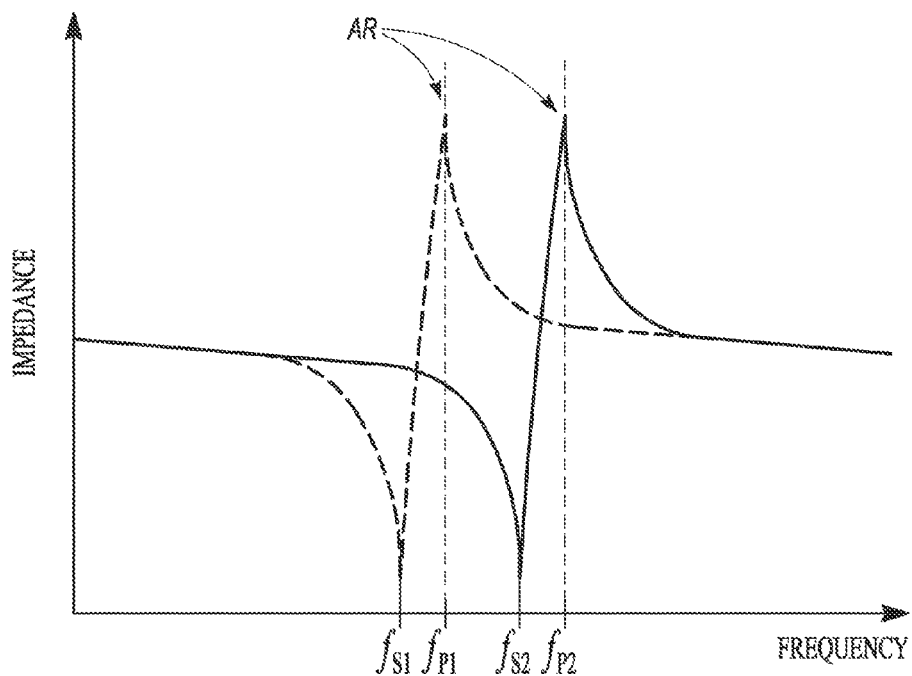
FIG. 8 is a graph of resonant and anti-resonant frequencies of an electric acoustic resonator according to an example embodiment.

FIG. 8 is a plot of the resonant and AR frequencies of an acoustic resonator, where $f_{S1}$ and $f_{P1}$ correspond to the resonant and AR frequencies, respectively, of the resonator. Similarly, $f_{S2}$ and $f_{P2}$ correspond to the resonant and AR frequencies of the resonator. In the configuration of FIG. 7 the resonator 708 is a mirror image of resonator 705, while the resonator 707 is a mirror image of resonator 706, meaning that the mirror images have the same dimensions and electrical parameters. The plot of FIG. 8 shows that each of these resonator mirrored pairs has a common resonant frequency and a common AR frequency. The bandwidth limitation of the filter in FIG. 7 is due to the juxtaposition of the resonant frequencies and the AR resonant frequencies. Furthermore, the separation of $f_S$ and $f_P$ is a function of the electro-acoustic parameter, $k_T$, and the impact of the AR high impedances in the circuit prevents the filter from having a smooth transition in the pass band and confine it to narrow bandwidth as seen in FIG. 9.

Figure 9:
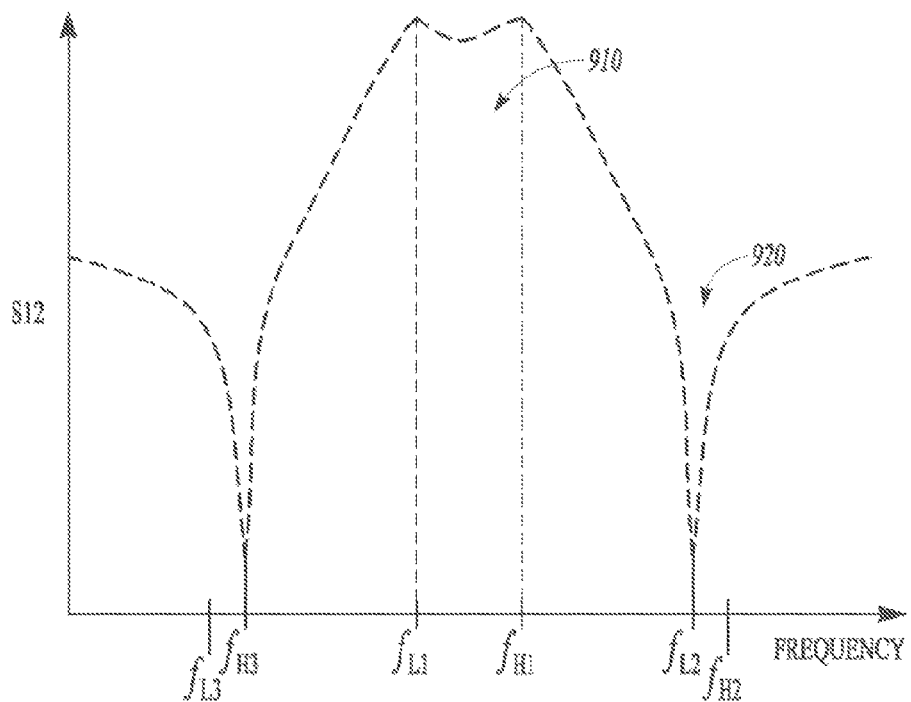
FIG. 9 is a graph illustrating a filter response of the filter of FIG. 7 according to an example embodiment.

FIG. 9 illustrates a resultant filter response of the circuit 700 which is fundamentally different from the individual resonant and AR frequencies. The desired pass band frequency range is identified by an upper band 910, while the desired rejection frequencies are identified at 920. The circuit 700 has a first pass band identified by $f_{L1}$ and $f_{H1}$ while the rejection bands occur at ($f_{L2}$, $f_{H2}$) and ($f_{L3}$, $f_{H3}$). The circuit 700 satisfies the frequency specification, while the bandwidth is limited if a smooth transition is required in the pass band. Addition of a compensation component such as 730 in circuit 700 effectively changes the equivalent circuit of the acoustic resonator to that of an electrical resonator. In other words, the resultant equivalent circuit effectively eliminates the static capacitance.

The static capacitance $C_o$ is affected by the standard parallel plate capacitance of area A on either side of the piezoelectric material (such as dielectric medium 235 in FIG. 2) of relative permittivity ∈r and thickness t, and thus partially characterizes the electrical component. Coupling coefficient $k_{eff}^2$ arises from the piezoelectric effect and which provides a mechanical component of the static capacitance. $k_T^2$, $k^2$ and $k_{eff}^2$ define various coupling coefficients of the piezoelectric material used in an acoustic resonator. For example, $k^2$ represents the piezoelectric coupling constant for a constant E, $k_T^2$ represents the piezoelectric coupling constant for a constant Distribution Field D, and $k^2_{eff}$ represents the effective coupling coefficient for the whole acoustic stack (z-axis), including the x-y dimensions of the acoustic stack and conductive electrodes 240 and 245 in FIG. 2A. Furthermore, these coupling coefficients may depend on the piezoelectric properties such as the crystal orientation and film thickness. Prior filters using resonators needed to increase $k^2_{eff}$ in order to increase the bandwidth of the filters. This may lead to a need to make the electrodes very thin, which effectively limits filter design and restricts manufacturing flexibilities.

Using the compensating impedance to minimize or eliminate the effect of $C_o$ acts to eliminate the impact of the anti-resonance and thus increases the filter bandwidth without having to increase $k^2_{eff}$. A large $k^2_{eff}$ is typically required in conventional filters, such as ladder and lattice filters, to increase the separation between resonance and anti-resonance. In the present embodiments that eliminate or minimize the effects of $C_o$, $k^2_{eff}$ may essentially be ignored.

The coupling coefficient $k^2_{eff}$ associated with the present embodiments is the acoustic coupling coefficient due to the piezoelectric material (235) and electrodes (240 and 245); and is a function of electrode thickness and piezoelectric material thickness. Prior attempts to maximize $k^2_{eff}$ led to attempts to make the electrodes very thin. Ratios of piezoelectric medium thickness to electrode thickness were typically around 10-20 to ensure a wide bandwidth. In the present embodiments, ratios as low as or lower than 2 may be used without adversely narrowing the bandwidth of the filter. Such a low ratio allows the use of thicker electrodes, which are easier to fabricate; in such applications, the use of thicker electrodes does not sacrifice filter bandwidth.

Elimination or reduction of the adverse effects of the static capacitance provides more flexibility and control of the filter capabilities available using EMC resonators to build broadband filtering devices, as can be seen from the above equation. By eliminating the effects, constraints on the design of the resonators may be significantly relaxed, making the resonator easier and cheaper to manufacture. As seen above, the area and thickness, as well as the $k^2_{eff}$ parameters all contribute to $C_o$. Constraints on these parameters may be relaxed due to the reduction in adverse effects caused by $C_o$. Increasing the acoustic coupling coefficient results in a desirable increase in bandwidth. While it also results in an increase in the $C_o$, that increase is compensated for by the compensation impedance.

One or more advantages of some embodiments of transversal filters incorporating a compensation impedance scheme, such as those described hereinabove, include a reduced insertion loss when incorporated into device circuitry, increased selectivity of desired frequencies, enhanced rejection of out-of-band frequencies, and increased filter bandwidth in the pass band. In some configurations, much of the static capacitance is absorbed as a function of the source-to-load capacitance and configuration of additional elements at the differential input and output, and the resultant filter response is free from AR effects. In some special cases, these additional elements at the differential input and output may not be required. In other cases, the cancellation of the AR capacitance $C_o$ may be achieved without source-to-load capacitive coupling. In addition to increasing the Q for such filters due to the inherent high-Q of BAW resonators, the resonator based filter architecture having at least one compensation impedance also provides a high-performance band pass filter with robust tolerance over a wide range of frequencies, including high frequency operation, and over a wide temperature range, avoiding shifting during practical operation.

A further advantage of some embodiments is that the sizes and numbers of resonators in the straight paths and complementary paths need not be the same. This provides great flexibility in filter design, allowing many different design strategies, such as polynomial or Chebyshev based filter designs to be utilized without constraints of equalizing the paths. The filters that may be designed include second order or higher, operate in the gigahertz and RF microwave regions in various embodiments, and have large bandwidths and sharp corners on the frequency response.

In one embodiment, values of the various compensation impedances may be calculated as a function of the sum of static capacitances in the straight and complementary paths of the filter:

$$C_{e-straight} = \Sigma C_{o-complementary} - \Sigma C_{o-straight} \quad (2)$$

or $$C_{e-complementary} = \Sigma C_{o-complementary} \Sigma C_{o-straight} \quad (3)$$

depending on which path contains the compensation impedance. By solving for $C_e$ for the selected path, and adding a suitable impedance to the filter affecting the appropriate path, the adverse effect of the static capacitance may be significantly reduced or removed. This represents the condition that the static capacitances of the resonators are cancelled or reduced by the added extra compensation impedance $C_e$. This is equivalent to using source-to-load capacitors to absorb the original static capacitances.

Figure 10A:
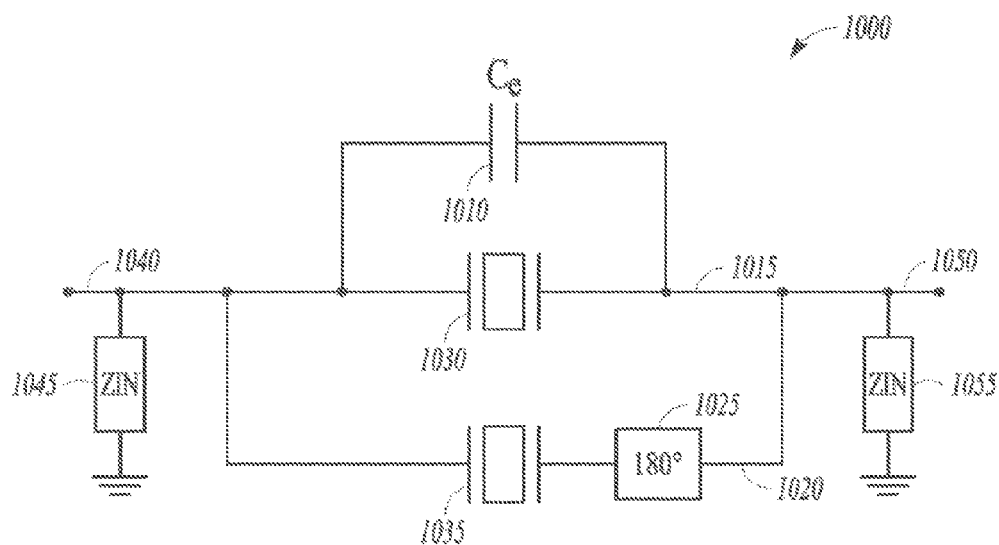
FIG. 10A is a block schematic equivalent circuit diagram of a single-ended transverse filter having electric acoustic resonators according to an example embodiment.

FIG. 10A is a block schematic diagram of a single-ended transverse filter 1000 having a compensation impedance 1010 coupled to a straight path 1015. A complementary path 1020 has a 180° phase shifter 1025. Examples of 180° phase shifters include a 180° delay line, a metamaterials phase shifter, a coupled-coil transformer, a coupled-line microstrip, and others. Both paths also have an acoustic resonator as indicated respectively by 1030 and 1035.

In one embodiment, a source end 1040 has an impedance 1045 coupled between the source 1040 and ground. A sink end 1050 may also have a further impedance 1055 coupled between it and ground. Values for the impedances 1045, 1055 may be determined as above, and each path may have multiple resonators in further embodiments. A series complex impedance may also be used in a filter path to reduce the effects of the static capacitances of the resonators according to still other embodiments.

Figure 10B:
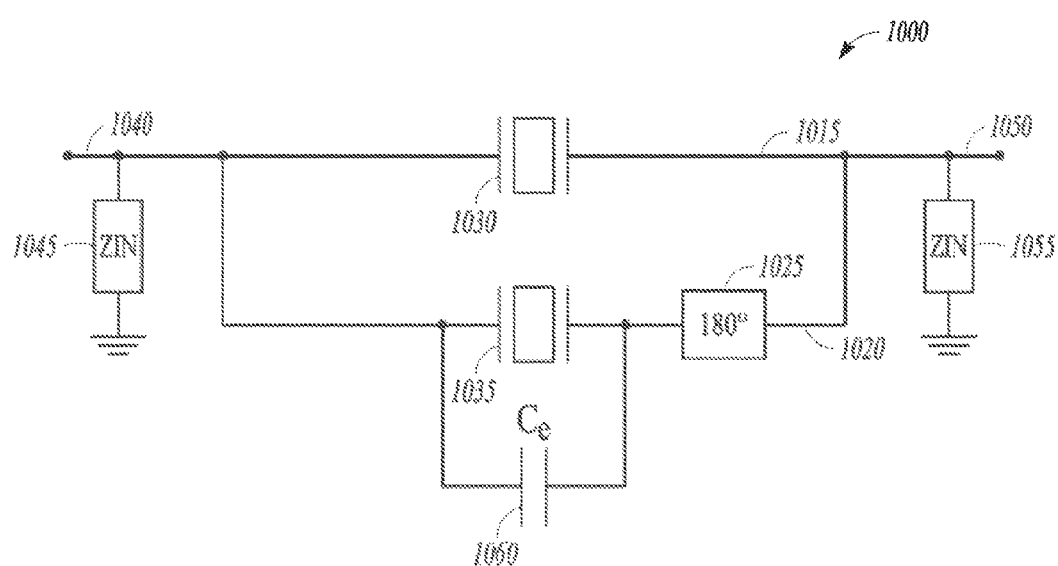
FIG. 10B is a block schematic circuit diagram of a single-ended transverse filter having a compensation impedance on an inverse path according to an example embodiment.

FIG. 10B is a block schematic circuit diagram of the single-ended transverse filter 1000 having a compensation impedance 1060 on the inverse path 1020. Thus, the compensation impedance 1060 may be used on either path in various embodiments.

Figure 11:
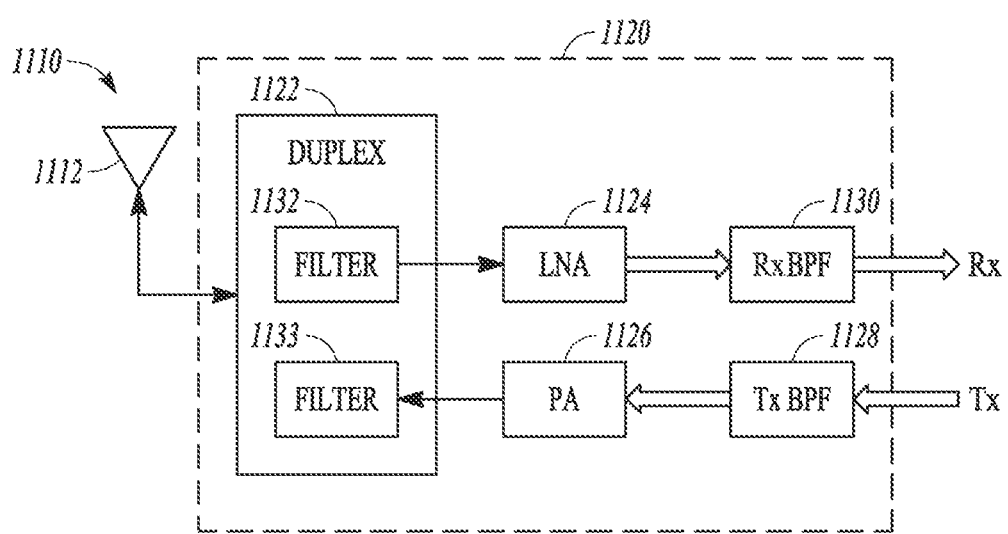
FIG. 11 is a block schematic circuit diagram of a RF transceiver using filters having electric acoustic resonators according to an example embodiment.

FIG. 11 is a block schematic diagram illustrating the use of filters in a Front End Module (FEM) 1120 of an RF transceiver device 1110. The FEM 1120 includes a duplexer module 1122 having multiple filters 1132 and 1133 for processing transmission signals via an antenna 1112. At least one of the filters 1132 and 1133 is a transverse filter having acoustic resonators with at least one of the straight and complementary paths having a compensation impedance as described above. The duplexer module 1122 operates in the frequency bands used by a receiver Rx and a transmitter Tx, providing adequate rejection of Tx noise occurring at the Rx frequency band and allowing sufficient isolation between the two bands to prevent distortion of the Rx frequency response.

In one embodiment, filter 1133 passes transmit, Tx, signals to the antenna 1112, while the other filter 1132 passes receive, Rx, signals received from the antenna 1112. The Tx signals are processed on the path including Tx Band Pass Filter (BPF) 1128 and Power Amplifier (P A) 1126. The Rx signals are processed on the path that includes Low Noise Amplifier (LNA) 1124 and Rx BPF 1130. The duplex module 1122 allows the antenna 1112 to be used for both Tx and Rx signals and their associated frequency bands.

Applications for filters incorporating compensation impedance, such as the device 1110, may be used to achieve stringent frequency band requirements. In developing communications technologies there is a growing need for frequency band isolation as multiple frequency bands are positioned close to each other in the frequency domain. In these cases guard band rejection requires sharp focused filter capabilities. The embodiments and examples provided herein allow the use of acoustic resonators in previously incompatible applications.

In one embodiment a dispersion engineering method is used to analyze a transversal filter to extract impedance and capacitance values, L and C, that meet a target filter response. Such methods may also be applied to other filter designs. A dispersion engineering method may also be used to determine the compensation impedance $C_e$ for a filter having acoustic resonators.

The advantages of these filters and configurations include a reduced insertion loss when incorporated into device circuitry, increased selectivity of desired frequencies, enhanced rejection of out-of-band frequencies, and increased bandwidth of the pass band. In some configurations, much of the parallel capacitance is absorbed as a function of the source-to-load capacitance, and the resultant filter response is free from AR effects. In addition to increasing the quality factor Q for such filters, such acoustic resonator configuration provides a high-performance BPF with robust tolerance over a wide range of frequencies, including high frequency operation, and over a wide temperature range, avoiding shifting during practical operation.

The invention claimed is:

1. A device comprising:
a plurality of electrode actuated acoustic resonators coupled to form complementary paths to operate as a filter, each acoustic resonator having an electrical input and an electrical output; and
a compensation impedance coupled to at least one of the paths,
wherein at least one of the paths includes a 180° phase shift.

2. The device of claim 1, wherein the compensation impedance is coupled to the at least one path to reduce an acoustic resonator static capacitance effect in the filter.

3. The device of claim 1, wherein the compensation impedance is configured to reduce the acoustic resonator static capacitance effect on filter bandwidth.

4. A communication device comprising:
at least one transceiver;
at least one antenna; and
at least one device according to claim 1.

5. The device of claim 1 wherein the compensation impedance comprises a capacitor coupled in parallel with a resonator in one path.

6. The device of claim 1 wherein the compensation impedance comprises a negative capacitance coupled between one path and ground.

7. The device of claim 1 wherein the compensation impedance comprises a capacitor coupled in parallel with a resonator in one path and a negative capacitance coupled between one path and ground.

8. The device of claim 1 wherein the compensation impedance comprises a compensation impedance coupled in series with one path.

9. The device of claim 1, wherein the acoustic resonators are Bulk Acoustic Wave (BAW) resonators having a Q of approximately 2000 or higher.

10. The device of claim 1, wherein the acoustic resonators are Surface Acoustic Wave (SAW) resonators having a Q of approximately 2000 or higher.

11. The device of claim 1, wherein the acoustic resonators have acoustic coupling coefficients, and wherein the compensation impedance is configured to offset decreases in the acoustic coupling coefficients of the acoustic resonators.

12. A device comprising:
a plurality of electrode actuated acoustic resonators coupled to form complementary paths to operate as a filter, each acoustic resonator having an electrical input and an electrical output; and
a compensation impedance coupled to at least one of the paths,
wherein the complementary paths include straight paths and phase shifted paths, and wherein the compensation impedance has a value determined to offset a static capacitance difference that is a function of the sum of static capacitances in the straight paths as compared to the sum of the static capacitances in the phase shifted paths.

13. A communication device comprising:
at least one transceiver;
at least one antenna; and
at least one device according to claim 12.

14. A device comprising:
a differential input port;
a differential output port;
a plurality of electrode actuated acoustic resonators coupled to form a filter including transverse complementary paths between the differential input port and the differential output port to operate as a bandpass filter, each acoustic resonator being part of a path; and
a compensation impedance coupled to at least one of the paths to reduce an acoustic resonator static capacitance effect in the filter,
wherein the complementary paths include straight paths and criss-cross paths, and wherein the compensation impedance has a value determined to offset a static capacitance difference that is a function of the sum of static capacitances in the straight paths as compared to the sum of the static capacitances in the criss-cross paths.

15. A communication device comprising:
at least one transceiver;
at least one antenna; and
at least one device according to claim 14.

16. A device comprising:
a differential input port;
a differential output port;
a plurality of electrode actuated acoustic resonators coupled to form a filter including transverse complementary paths between the differential input port and the differential output port to operate as a bandpass filter, each acoustic resonator being part of a path; and a compensation impedance coupled to at least one of the paths to reduce an acoustic resonator static capacitance effect in the filter, wherein the compensation impedance comprises a capacitor coupled in parallel with a resonator in one path.

17. The device of claim 16, wherein the compensation impedance includes an inductance element coupled between electrodes of the differential input port.

18. The device of claim 16, wherein the acoustic resonators are Bulk Acoustic Wave (BAW) resonators.

19. The device of claim 16, wherein the acoustic resonators are Surface Acoustic Wave (SAW) resonators having a Q of approximately 2000 or higher.

20. A communication device comprising:
at least one transceiver;
at least one antenna; and
at least one device according to claim 16.

21. A device comprising:
differential input port;
a differential output port;
a plurality of electrode actuated acoustic resonators coupled to form a filter including transverse complementary paths between the differential input port and the differential output port to operate as a bandpass filter, each acoustic resonator being part of a path; and
a compensation impedance coupled to at least one of the paths to reduce an acoustic resonator static capacitance effect in the filter, wherein the compensation impedance comprises a negative capacitance coupled between one path and a complementary criss-cross path.

22. The device of claim 21 wherein the compensation impedance further comprises a capacitor coupled in parallel with a resonator in one path.

23. A communication device comprising:
at least one transceiver;
at least one antenna; and
at least one device according to claim 21.

24. A method comprising:
determining a first sum of static capacitances in a first set of acoustic resonator paths in a filter;
determining a second sum of static capacitances in a second set of acoustic resonator paths in the filter, wherein the second set of paths are complementary to the first set of paths; and
adding a compensation impedance to one of the paths as a function of the first and second sums.

* * * * *

UNITED STATES PATENT AND TRADEMARK OFFICE
CERTIFICATE OF CORRECTION

PATENT NO. : 8,576,024 B2
APPLICATION NO. : 12/950908
DATED : November 5, 2013
INVENTOR(S) : Erb et al.

It is certified that error appears in the above-identified patent and that said Letters Patent is hereby corrected as shown below:

In the Specification

In Column 1, Line 3, delete "APPLICATION" and insert -- APPLICATIONS --, therefor.

In Column 8, Line 25, in Equation (3), delete "$C_{e\text{-complementary}} = \Sigma C_{o\text{-complementary}} \Sigma C_{o\text{-straight}}$" and insert -- $C_{e\text{-complementary}} = \Sigma C_{o\text{-complementary}} - \Sigma C_{o\text{-straight}}$ --, therefor.

In the Claims

In Column 11, Line 18, in Claim 21, delete "differential" and insert -- a differential --, therefor.

Signed and Sealed this
Sixth Day of May, 2014

Michelle K. Lee
*Deputy Director of the United States Patent and Trademark Office*